(12) United States Patent
Kato

(10) Patent No.: US 9,922,842 B2
(45) Date of Patent: Mar. 20, 2018

(54) HEAT TREATMENT METHOD

(71) Applicant: SHIN-ETSU HANDOTAI CO., LTD., Tokyo (JP)

(72) Inventor: Masahiro Kato, Takasaki (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 70 days.

(21) Appl. No.: 15/022,846

(22) PCT Filed: Oct. 27, 2014

(86) PCT No.: PCT/JP2014/005417
§ 371 (c)(1),
(2) Date: Mar. 17, 2016

(87) PCT Pub. No.: WO2015/079621
PCT Pub. Date: Jun. 4, 2015

(65) Prior Publication Data
US 2016/0233107 A1    Aug. 11, 2016

(30) Foreign Application Priority Data
Nov. 26, 2013 (JP) .................. 2013-244374

(51) Int. Cl.
*H01L 21/324* (2006.01)
*H01L 21/673* (2006.01)
*H01L 21/67* (2006.01)

(52) U.S. Cl.
CPC ...... *H01L 21/324* (2013.01); *H01L 21/67109* (2013.01); *H01L 21/67306* (2013.01)

(58) Field of Classification Search
CPC .................... H01L 21/67306; H01L 21/324
See application file for complete search history.

(56) References Cited

U.S. PATENT DOCUMENTS 6,062,853 A    5/2000    Shimazu et al.
2002/0113027 A1    8/2002    Minami et al.
(Continued)

FOREIGN PATENT DOCUMENTS

CN    101275286 A    10/2008
CN    101990699 A    3/2011
(Continued)

OTHER PUBLICATIONS

Mar. 9, 2017 extended Search Report issued in European Patent Application No. 14865182.1.
(Continued)

*Primary Examiner* — Steven B McAllister
*Assistant Examiner* — Steven Anderson, II
(74) *Attorney, Agent, or Firm* — Oliff PLC

(57) ABSTRACT

A method for heat treatment of a plurality of semiconductor wafers horizontally placed on a supporting member coated with SiC in a vertical heat treatment furnace includes performing heat treatments while switching the supporting member and a heat treatment condition such that the supporting member is continuously used in a heat treatment under either one of a first condition and a second condition for a certain period of time and then continuously used in a heat treatment under the other condition for a certain period of time, wherein the heat treatment under the first condition is performed at 1000° C. or higher in an atmosphere containing a rare gas and not containing oxygen, and the heat treatment under the second condition is performed at 1000° C. or higher in an atmosphere containing oxygen and not containing a rare gas. As a result, slip dislocation can be inhibited.

4 Claims, 2 Drawing Sheets

(56) References Cited

U.S. PATENT DOCUMENTS

| | | | |
|---|---|---|---|
| 2006/0024969 A1* | 2/2006 | Shive | C04B 41/009 438/706 |
| 2007/0028945 A1* | 2/2007 | Kusaba | C04B 41/009 134/2 |
| 2007/0128837 A1* | 6/2007 | Goela | C23C 16/4404 438/479 |
| 2008/0176415 A1 | 7/2008 | Kim et al. | |
| 2008/0237190 A1* | 10/2008 | Aoki | C09K 13/08 216/99 |
| 2010/0129761 A1* | 5/2010 | Kobayashi | H01L 21/67306 432/253 |
| 2011/0028005 A1 | 2/2011 | Kobayashi | |
| 2013/0023108 A1* | 1/2013 | Hanaoka | H01L 21/02238 438/458 |
| 2013/0078588 A1 | 3/2013 | Senda et al. | |
| 2013/0093060 A1 | 4/2013 | Oka et al. | |

FOREIGN PATENT DOCUMENTS

| | | |
|---|---|---|
| JP | H10-92757 A | 4/1998 |
| JP | 2002-274983 A | 9/2002 |
| JP | 2002-324830 A | 11/2002 |
| JP | 2004-241545 A | 8/2004 |
| JP | 2005-101161 A | 4/2005 |
| JP | 2008-277781 A | 11/2008 |
| JP | 2010-283153 A | 12/2010 |
| JP | 2012-023182 A | 2/2012 |
| TW | 2010-03833 A | 1/2010 |
| TW | 201314778 A | 4/2013 |
| WO | 2009/128225 A1 | 10/2009 |

OTHER PUBLICATIONS

Jan. 27, 2015 International Search Report issued in International Patent Application No. PCT/JP2014/005417.

Oct. 4, 2016 Office Action issued in Taiwanese Patent Application No. 103138382.

Oct. 4, 2016 Search Report issued in Taiwanese Patent Application No. 103138382.

May 4, 2017 Office Action issued in Chinese Patent Application No. 201480052178.9.

* cited by examiner

HEAT TREATMENT METHOD

TECHNICAL FIELD

The present invention relates to a method for heat treatment of semiconductor wafers, and particularly to a method for heat treatment of silicon single crystal wafers.

BACKGROUND ART

A heat treatment technique is a fundamental and important technique which has been used for various semiconductor processes. For example, the heat treatment is performed on a silicon single crystal wafer used as a semiconductor substrate to modify a crystal quality, diffuse impurities, or form a film structure in a surface layer portion.

As a heat treatment apparatus for performing a heat treatment, a batch type apparatus capable of simultaneously processing multiple wafers at predetermined intervals has been widely used. In particular, an apparatus in which wafers are placed in a vertical direction while holding each wafer horizontally is called a vertical furnace. An apparatus in which wafers are placed in a horizontal direction while holding each wafer nearly upright is called a horizontal furnace.

The vertical furnace is often used for wafers which progress toward having larger diameter in recent years. A supporting member for holding wafers in the heat treatment furnace is also referred to as boat, and a boat made of quartz (quartz boat) and a boat made of SiC (SiC boat) in which the surface of SiC material is subjected to CVD-SiC coating are generally used.

Especially, a SiC supporting member, which has high resistance to heat, has been widely used in a heat treatment at high temperature. The supporting member varies in shape. A common supporting member for the vertical furnace has three or four vertical columns coupled by two plate members (a top plate and a bottom plate), and grooves are horizontally formed on parts of the columns. Wafers are placed on horizontal planes of the grooves and thereby held.

The silicon single crystal wafers placed on such a supporting member are subjected to a heat treatment, for example, under an argon or oxygen atmosphere. It has been known that a defect called slip dislocation is generated from a contact portion with the supporting member in this heat treatment (see Patent Document 1 and Patent Document 2).

CITATION LIST

Patent Literature

Patent Document 1: Japanese Unexamined Patent publication (Kokai) No. 2004-241545
Patent Document 2: Japanese Unexamined Patent publication (Kokai) No. 2005-101161

SUMMARY OF INVENTION

Technical Problem

The slip dislocation is a defect generated by slipping a silicon crystal structure over several millimeters to several centimeters in length, which begins with mechanical damage caused when the silicon single crystal wafer comes into contact with the supporting member, followed by a stress due to the wafer's own weight, a stress caused upon thermal deformation, and a thermal energy of high temperature.

When the vertical furnace is used, the wafer's own weight is dispersed and good uniformity of thermal distribution of the wafer surface is achieved, so that the slip dislocation tends to be inhibited, compared with the horizontal furnace. However, the slip dislocation may frequently occur even when the vertical furnace is used, especially in the case that a SiC supporting member is used. Furthermore, there are some cases that even if supporting members to be used are manufactured based on the same design, condition where the slip dislocation occurs may differ from each supporting member; even if the slip dislocation does not occur at the beginning of use, the slip dislocation may occur through long-term use.

The present invention was accomplished in view of the above-described problems. It is an object of the present invention to provide a heat treatment method that can inhibit the generation of slip dislocation.

Solution to Problem

To achieve this object, the present invention provides a method for heat treatment of a plurality of semiconductor wafers horizontally placed on a supporting member coated with SiC in a vertical heat treatment furnace, the method comprising: performing heat treatments while switching the supporting member and a heat treatment condition such that the supporting member is continuously used in a heat treatment under either one of a first condition and a second condition for a certain period of time and then continuously used in a heat treatment under the other condition for a certain period of time, wherein the heat treatment under the first condition is performed at 1000° C. or higher in an atmosphere containing a rare gas and not containing oxygen, and the heat treatment under the second condition is performed at 1000° C. or higher in an atmosphere containing oxygen and not containing a rare gas.

Such a heat treatment method can inhibit deformation of the surface of the supporting member on which semiconductor wafers are placed, and thus inhibit the slip dislocation at low cost.

The rare gas is preferably an argon gas. Moreover, each of the certain periods of time for which the heat treatments under the first and the second conditions are continued is preferably 200 hours or more and 400 hours or less.

In this manner, the slip dislocation can be surely inhibited at low cost.

Moreover, the switching of the supporting member and the heat treatment condition is preferably repeated a plurality of times.

In this manner, the using time of one supporting member is increased, thereby enabling further reduction in cost.

Advantageous Effects of Invention

In the present invention, heat treatments are performed while switching the supporting member and the heat treatment condition such that the supporting member is continuously used in a high-temperature heat treatment under either one of the first condition (at 1000° C. or higher in an atmosphere containing a rare gas and not containing oxygen) and the second condition (at 1000° C. or higher in an atmosphere containing oxygen and not containing a rare gas) for a certain period of time and then continuously used in another high-temperature heat treatment under the other condition for a certain period of time. The deformation of the surface of the supporting member on which semiconductor wafers are placed is thereby inhibited, and thus the slip dislocation can be inhibited at low cost.

DESCRIPTION OF EMBODIMENTS

Hereinafter, embodiments of the present invention will be described, but the present invention is not limited thereto.

Figure 1:
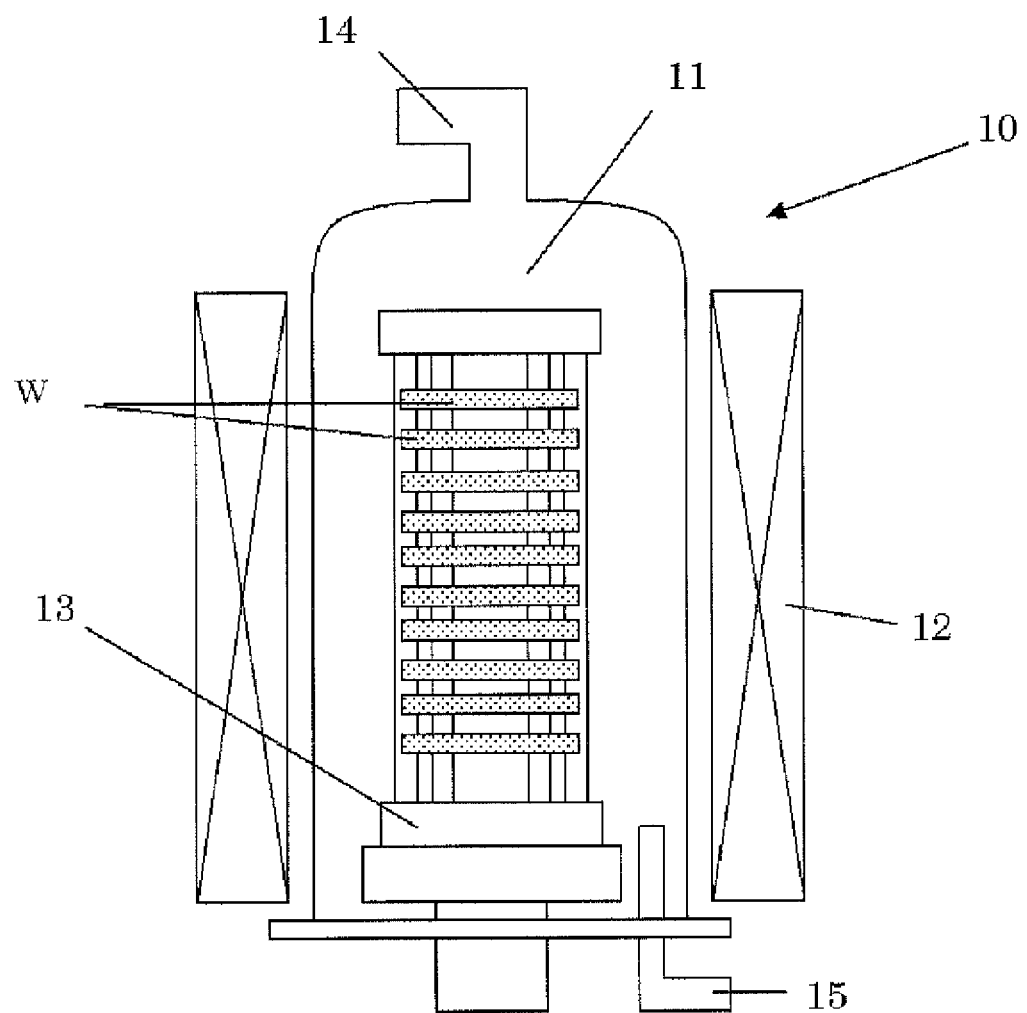
FIG. 1 is a schematic view of an exemplary vertical heat treatment furnace usable in the inventive heat treatment method.

In the inventive heat treatment method, a vertical heat treatment furnace as illustrated in FIG. 1 can be used.

As shown in FIG. 1, the vertical heat treatment 10 includes a reaction chamber 11 and a supporting member 13 (wafer boat) disposed within the reaction chamber 11. Heaters 12 are provided around the reaction chamber 11.

A plurality of semiconductor wafers W can be placed on the supporting member 13 each horizontally. For example, columns of the supporting member 13 may have grooves formed on their side surfaces in a horizontal direction so that each lower surface of the grooves serves as a wafer-supporting surface. The wafer-supporting surface may be, for example, a semicircular supporting surface formed in a cylindrical column or a rectangular supporting surface formed in a square column. At least the wafer-supporting surfaces of the supporting member 13 are coated with SiC, which has high resistance to heat, whereby metal contamination of wafers can be prevented during heat treatment. CVD may be used for coating with SiC.

The supporting member 13 is detachably provided in the vertical heat treatment furnace 10. Therefore, the supporting member 13 can be disposed within the vertical heat treatment furnace 10 and detached from the vertical heat treatment furnace 10 while the wafers W are placed thereon.

In the heat treatment, while a gas is introduced into the reaction chamber 11 through a gas inlet 14, the wafers W are heated with the heaters 12. The introduced gas flows from above to below, and is discharged outside from a gas outlet 15.

The heat treatment condition in the inventive heat treatment method includes the first condition and the second condition, and the combination of these conditions and the supporting member 13 to be used is determined. Specifically, the supporting member and the heat treatment condition are switched such that the supporting member 13 is continuously used in a high-temperature heat treatment under either one of the first and the second conditions for a certain period of time and then continuously used in a high-temperature heat treatment under the other condition for a certain period of time.

In this case, the supporting member and the heat treatment condition can be switched by changing the heat treatment condition while one supporting member is continuously used in one vertical heat treatment furnace 10. Alternatively, the switching may be done by exchanging the supporting member to be used for another that has been used under the other condition while the same heat treatment condition is continuously applied in the heat treatments.

Thus, the slip dislocation can be inhibited by performing the heat treatments while switching the supporting member and the heat treatment condition, as described later in detail.

The heat treatment under the first condition is performed at 1000° C. or higher in an atmosphere containing a rare gas and not containing oxygen. The heat treatment under the second condition is performed at 1000° C. or higher in an atmosphere containing oxygen and not containing a rare gas. The atmosphere of the first condition is typified by an argon atmosphere (Ar gas 100%). The atmosphere of the second condition is typified by an oxygen atmosphere ($O_2$ gas 100%).

When the heat treatment temperatures of the first and the second conditions are lower than 1000° C., the generation of the slip dislocation is inhibited, so that the effect of the preset invention cannot be obtained sufficiently. The temperature is preferably 1350° C. or lower because the slip dislocation can be surely prevented from remarkably increasing.

Each of the certain periods of time for which the heat treatments under the first and the second conditions are continued is preferably, but not limited to, 200 hours or more and 400 hours or less, for example. When the period is 200 hours or more, the increase in cost due to increased frequency of changing the supporting member 13 can be inhibited. When the period is 400 hours or less, the slip dislocation can be inhibited more surely.

Alternatively, the amount of slip dislocation may be measured on wafers after heat treatment, and a time it takes this amount to exceed a predetermined threshold may be determined as the certain periods of time.

Detailed explanation is now given about a cause of the slip dislocation generation which the present inventor has found from studies.

The surface condition of the supporting member to come into contact with wafers significantly affects the generation of the slip dislocation. Especially, since the CVD-SiC-coated supporting member has rough surface, a wafer placed on the supporting member is held in point contact with a slightly elevated portion. Therefore, it is supposed that internal stress due to the wafer's own weight is locally increased, which easily causes the slip dislocation.

A phenomenon that the generation of the slip dislocation increases through long-term continuous use of the supporting member is supposed to be caused by the change in surface roughness shape of the supporting member.

In a conventional heat treatment, one type or multiple types of high purity gas is fed into a furnace. As typical gas species used in the heat treatment of semiconductor wafers, oxygen, nitrogen, hydrogen, argon, and so on are used. Until now, deformation of the supporting member surface due to long-term use has been supposed to be a common phenomenon regardless of these gas species. Practically, it has been observed that the generation of the slip dislocation increases in a supporting member subjected to a heat treatment in any case of an argon atmosphere and an oxygen atmosphere.

However, when the present inventor has actually studied in detail the surface condition of a supporting member after heat treatment, it has turned out that the surface condition differs depending on gas species.

The surface of a CVD-SiC-coated supporting member has grains having a size of 1 to 5 μm inherently, and each grain has sharp shape. When such a supporting member surface is subjected to a heat treatment under a rare gas (inert gas) atmosphere such as an argon atmosphere for a long time, an end portion of the sharp grain is rounded. Whereas, when the supporting member surface is subjected to a heat treatment under an oxygen atmosphere for a long time, the end portion of the sharp grain is further sharpened. In this way, change of the end shape exhibits an opposite trend between the argon atmosphere and the oxygen atmosphere.

By contrast, the generation of the slip dislocation tends to increase in both atmospheres. It appears to be contradictory, but it can be interpreted as follows.

When the heat treatment is performed under a rare gas atmosphere for a long time, as described above, the end portion of the grain on the supporting member surface is rounded, whereby a contact area of the end portion with a wafer is increased. This causes the increase in friction caused when the wafer and the supporting member are horizontally slipped relative to each other. Practically, the wafer during the heat treatment is horizontally slipped relative to the supporting member because of thermal expansion. When the friction is small at this time, both are smoothly slipped. However, when the friction is large, horizontal stress before slipping is increased, and the slip dislocation is supposed to increase due to this stress.

In this respect, the oxygen atmosphere sharpens the end portion of the grain, thereby decreasing the contact area per point and thus the friction. However, stress concentration in a vertical direction due to the wafer's own weight is increased at each contact point, and the slip dislocation is supposed to increase due to this stress.

As explained above, mechanism of deteriorating the slip dislocation differs between two atmospheres of the rare gas atmosphere and the oxygen atmosphere, and each mechanism has opposite characteristics.

Accordingly, when heat treatments are performed while switching the supporting member to be used and the heat treatment condition like the present invention, the change in shape of the grains on the supporting member surface can be switched between round and sharp, and in a manner, regeneration effect on the surface condition can be obtained. Thus, the generation of the slip dislocation based on the change in shape of the grain as described above can be effectively reduced. Such a method can inhibit the slip dislocation only by switching the supporting member to be used and the heat treatment condition, thus enabling improvement in productivity at low cost, compared with the case of exchanging the supporting member for new one. Furthermore, when the switching is repeated multiple times, the using time of the supporting member is increased, thus enabling further reduction in cost.

EXAMPLE

Hereinafter, the present invention will be described in more detail with reference to example and comparative example, but the present invention is not limited thereto.

Example

High-temperature heat treatment was performed on silicon single crystal wafers according to the inventive heat treatment method. Two vertical heat treatment furnaces as shown in FIG. 1 were prepared, and a heat treatment under the first condition and a heat treatment under the second condition were performed with the respective vertical heat treatment furnaces. Each supporting member provided in the two vertical heat treatment furnaces was the same CVD-SiC-coated boat of four-point support type, made of SiC.

The high-temperature heat treatment under the first condition was performed in the following condition: an argon atmosphere; maximum temperature was 1200° C.; retention period at the maximum temperature was 1 hour; including heating and cooling steps before and after the retention period at the maximum temperature. The high-temperature heat treatment under the second condition was performed in the following condition: an oxygen atmosphere; maximum temperature was 1050° C.; retention period at the maximum temperature was 1 hour; including heating and cooling steps before and after the retention period at the maximum temperature.

After the heat treatments under the first and the second conditions were each continued for 300 hours, the two vertical heat treatment furnaces exchanged the supporting members, and the heat treatments were further continued under the same condition, respectively. The incidence of the slip dislocation during the period was then examined. The slip dislocation was quantified by distinguishing a slip dislocation image from an X-ray diffraction image and evaluating incidence of the slip dislocation contained in the wafers as the slip amount.

Figure 2:
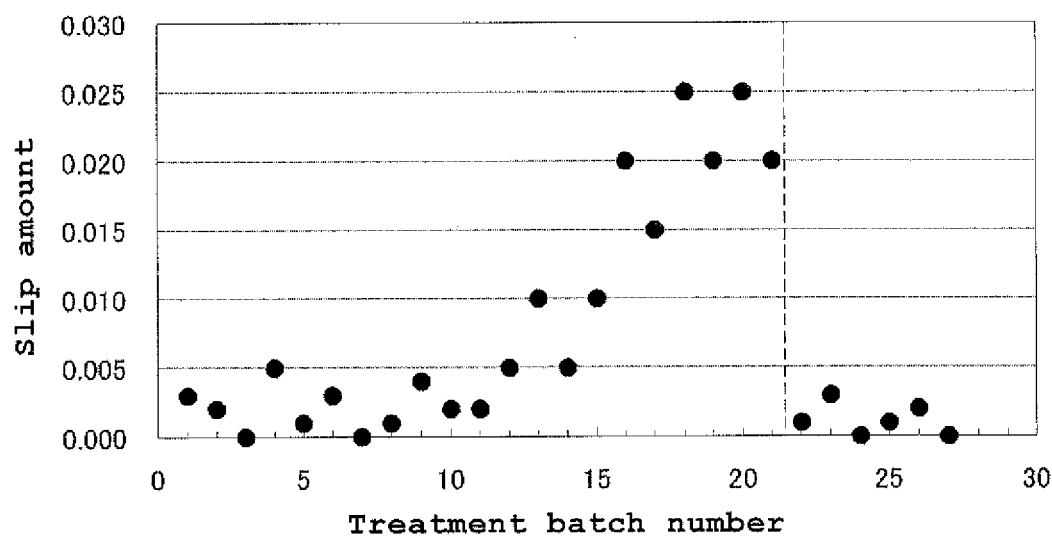
FIG. 2 is a diagram showing the slip amount of wafers subjected to a high-temperature heat treatment under an argon atmosphere in example.
Figure 3:
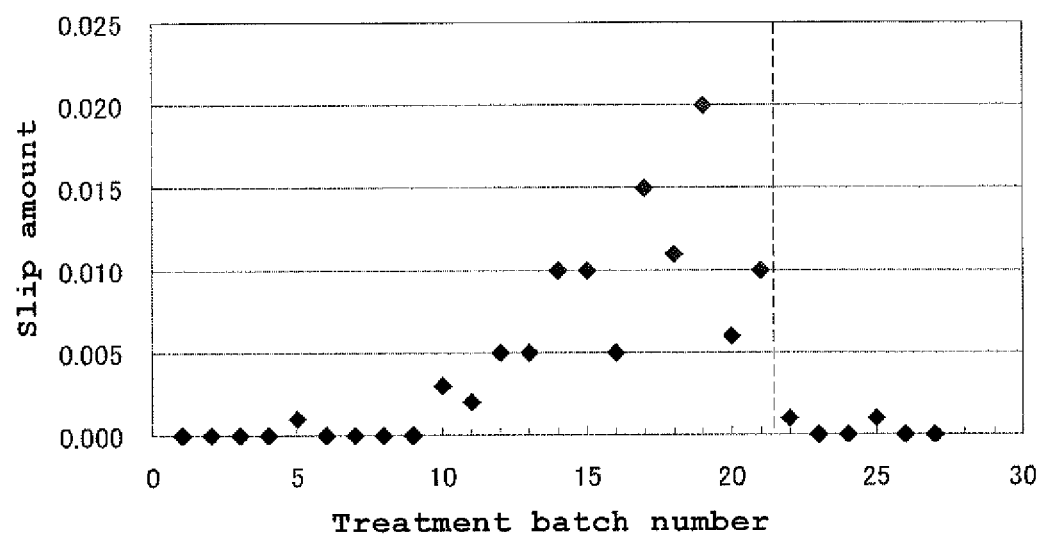
FIG. 3 is a diagram showing the slip amount of wafers subjected to a high-temperature heat treatment under an oxygen atmosphere in example.

FIG. 2 shows the relationship between slip amount of the wafers subjected to the high-temperature heat treatment under the first condition and the number of treatment batches. FIG. 3 shows the relationship between slip amount of the wafers subjected to the high-temperature heat treatment under the second condition and the number of treatment batches. As to the number of treatment batches of the horizontal axis in FIGS. 2 and 3, one batch corresponds to 10 times heat treatments. Moreover, FIGS. 2 and 3 partially omit data at the beginning of use of the supporting member, and shows only data shortly before the slip dislocation begins to increase and data after the increase.

In both of FIG. 2 and FIG. 3, the slip amount at the beginning of use of the supporting member was small, but after that, the slip amount increased due to long-term continuous use. The dotted line shown in FIG. 2 and FIG. 3 represents a timing for exchanging the supporting members. The respective slip amounts were significantly reduced after this timing. In addition, this reduction effect was then continued for a long time.

As described above, it was demonstrated that the slip dislocation could be reduced by performing heat treatments while switching the supporting member and the heat treatment condition according to the inventive heat treatment method.

It is predicted that the slip amounts keep increasing when the supporting members are continuously used without switching, like the conventional method.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for heat treatment of a plurality of semiconductor wafers horizontally placed on a supporting member coated with SiC in a vertical heat treatment furnace, the method comprising:

Performing heat treatments by switching heat treatment condition of the supporting member having the plurality of semiconductor wafers horizontally placed thereon, such that the supporting member is used in a heat treatment under either one of a first condition treating a plurality of batches of wafers and a second condition treating a different plurality of batches of wafers for a certain period of time and then directly following the one condition, used in a heat treatment under the other condition for a certain period of time, wherein The heat treatment under the first condition is performed at 1000° C. or higher in an atmosphere containing a rare gas and not containing oxygen, and the heat treatment under the second condition is performed at 1000° C. or higher in an atmosphere containing oxygen and not containing a rare gas, and Each of the certain periods of time for which the heat treatments under the first and second conditions are continued is between 200 and 400 hours.

2. The method for heat treatment according to claim 1, wherein the rare gas is an argon gas.

3. The method for heat treatment according to claim 1, wherein switching the heat treatment condition of the supporting member is repeated a plurality of times.

4. The method for heat treatment according to claim 2, wherein switching the heat treatment condition of the supporting member is repeated a plurality of times.

* * * * *